United States Patent [19]
Cheung

[11] Patent Number: 6,154,067
[45] Date of Patent: Nov. 28, 2000

[54] METHODS OF AND APPARATUS FOR MONITORING THE TERMINATION STATUS OF A SCSI BUS

[75] Inventor: Peter K. Cheung, Milpitas, Calif.

[73] Assignee: Adaptec, Inc., Milpitas, Calif.

[21] Appl. No.: 09/130,196

[22] Filed: Aug. 5, 1998

[51] Int. Cl.$^7$ ............................. H03K 5/22; H03K 5/153
[52] U.S. Cl. ............................................. 327/74; 327/77
[58] Field of Search ................................. 327/51, 52, 56, 327/74, 75, 77, 78, 88; 326/20

[56] References Cited

U.S. PATENT DOCUMENTS

| | | | |
|---|---|---|---|
| 4,827,260 | 5/1989 | Sugawa et al. | 341/118 |
| 5,367,204 | 11/1994 | Mattison | 327/75 |
| 5,418,918 | 5/1995 | Vander Kamp et al. | 395/375 |
| 5,694,600 | 12/1997 | Khenson et al. | 395/652 |
| 5,943,272 | 8/1999 | Chang | 365/189.09 |
| 5,953,540 | 9/1999 | Raymond | 395/882 |

OTHER PUBLICATIONS

Voltage Comparator Circuit (C.D. Driscoll, IBM Technical Disclosure Bulletin, vol. 17 No. 4, pp. 1151–1152, Sep. 1974.
Unknown, "*ASUS PCI–DA2100 PCI to SCSI Disk Array Controller*", User's Manual, Rev. 1.22, 11–96, ASUSTeK Computer, Inc.

*Primary Examiner*—Toan Tran
*Assistant Examiner*—Quan Tra
*Attorney, Agent, or Firm*—Martine Penilla & Kim, LLP

[57] ABSTRACT

When more than two terminators are on a SCSI bus the bus is said to be "over-terminated", and when less than two terminators are on the bus, the bus is said to be "under-terminated". When the SCSI bus is either under or over terminated, the bus does not function, and often the user does not know why the bus is not functioning. Apparatus and a method are provided for indicating to the user when the bus is not properly terminated. A terminator monitoring system and method operate in conjunction with the bus. A precision resistor is connectable to the bus so that a voltage drop is produced across the precision resistor. A circuit monitors the value of the produced voltage drop across the precision resistor to provide an indication of the number of terminators on the bus. A switch selectably connects the precision resistor to the bus, and there is a source of a reference voltage. The monitoring circuit includes a comparison circuit responsive to the voltage drop across the precision resistor and to the reference voltage for indicating whether the number of terminators on the bus exceeds a limit or is less than the limit. The system notifies a system user of an undesired (or improper) termination condition of the bus, wherein each of a plurality of devices connected to the bus may have a termination enabled.

31 Claims, 6 Drawing Sheets

| Data 202 | | |
|---|---|---|
| Bit 0 | Bit 1 | Termination |
| 0 | 0 | Invalid |
| 0 | 1 | Over |
| 1 | 0 | Under |
| 1 | 1 | Normal |

METHODS OF AND APPARATUS FOR MONITORING THE TERMINATION STATUS OF A SCSI BUS

BACKGROUND OF THE INVENTION

1. Field of the Invention

This invention relates to terminators for SCSI buses, and more particularly, to monitoring the termination status of terminations on a small computer system interface (SCSI) bus.

2. Description of the Related Art

Buses that comply with the SCSI standard ("SCSI buses") have been generally perceived as being "difficult to use" due to the strict requirements for bus termination set forth in the SCSI standard. For example, for proper termination, SCSI buses must have two, and only two, terminators connected to each end of a particular bus. A device having bus termination capability is said to either be "enabled" or "disabled", according to whether the "status" of the device currently is, or is not set, for bus termination. As is well known to those skilled in the art, a terminator is any device capable of providing termination of the SCSI bus, and which is actually enabled for termination.

It is also known that a passive terminator device may be a terminator merely by being connected to the bus, for example, and that to avoid having the passive terminator device be a terminator, the passive terminator device must be disconnected from the SCSI bus. Also, SCSI bus termination by most computer peripheral devices is not automatic. Rather, such devices require manual insertion or removal of shunt jumpers to enable or disable the device.

As a result of the need to physically disconnect the passive devices to avoid having them be a terminator, and as a result of the need to manually remove the shunt jumpers from the peripheral devices, the termination status of the SCSI bus is too often improper. That is, more than two terminators are set on a single SCSI bus, in which case the bus is said to be "over-terminated", or less than two terminators may be set on the bus, in which case the bus is said to be "under-terminated". Moreover, when the SCSI bus is either under-terminated or over-terminated, the bus will not function properly, and often the user does not know why the bus is not functioning. It may be understood then, that there is an unfilled need for the user to know when the bus is not properly terminated, other than having the bus be inoperative.

SUMMARY OF THE INVENTION

Broadly speaking, the present invention fills this need for the user to know when the bus is not properly terminated by providing a terminator monitoring system and method in conjunction with a SCSI bus to indicate when the bus is either under-terminated or over-terminated. In another embodiment, a system for monitoring a number of terminators on a bus includes a precision resistor connectable to the bus so that a voltage drop is produced across the precision resistor, and a circuit for monitoring the value of the produced voltage drop across the precision resistor to provide an indication of the number of terminators on the bus. An additional aspect of this embodiment includes a switch for connecting the precision resistor to the bus, a source of a reference voltage; and the monitoring circuit contemplates a comparison circuit responsive to the voltage drop across the precision resistor and to the reference voltage for indicating whether the number of terminators on the bus exceeds a limit or is less than the limit.

Still another embodiment of the present invention contemplates a system for notifying a system user of an undesired (or improper) termination condition of a bus, wherein each of a plurality of devices connected to the bus may have a termination enabled. The system includes provisions for determining whether only two of the devices have terminations enabled, and provisions for signaling to provide a notice to the user if less than two or more than two of the devices have terminations enabled. In this embodiment, the determining provision may contemplate precision resistance facilities connected to the bus for providing a voltage drop, voltage divider facilities connected across the precision resistance means for measuring the voltage drop across the precision resistance means, and facilities for comparing the voltage drop across the precision resistance means to a reference voltage. A detailed aspect of this embodiment may be that the improper termination condition exists if either more or less than two terminators are connected to the bus, and wherein the comparing facilities generate a logical low signal if other than two terminators are connected to the bus.

Still another embodiment of the present invention contemplates a computer-implemented method for determining the termination status of a bus, where in devices connected to the bus may either have an enabled terminator status or a disabled terminator status, and wherein the devices having the enabled terminator status conduct current. The method contemplates operations for providing a reference signal, comparing the reference signal to a signal generated by the current through a resistor; and determining the termination status of the bus according to the results of the comparing operation.

This embodiment of the method may also contemplate having the termination status either be over-terminated or under-terminated, wherein the comparing operation compares a first reference signal to the generated signal to determine whether the termination status is over-terminated, and separately compares a second reference signal to the generated signal to determine whether the termination status is under-terminated.

A further aspect of this embodiment may include, before performing the above operations, determining whether the bus is busy, and if the bus is not busy, connecting the resistor to the bus. Once the determining operation has been completed, the embodiment may disconnect the resistor from the bus. Also, if the termination status is undesired (i.e., over-terminated or under-terminated), a notice is caused to be displayed on the screen of the computer to indicate the undesired status.

In these various embodiments, the bus may be a SCSI bus having a reset line, and the resistor may be connected to the reset line.

In yet a further embodiment of the present invention, there may be provided a host adapter card having a termination status notice capability for use with a bus to indicate an undesired termination status of the bus. Such host adapter card may include facilities for producing a voltage drop in response to a current, switch facilities for connecting the voltage drop facilities to the bus to provide the current to the voltage drop facilities, and facilities for comparing such voltage drop to at least one reference voltage to generate at least one logical signal indicative of the termination status of the bus. Such embodiment also includes devices for storing the at least one logical signal. Additionally, within this embodiment there may be the comparing facilities generating the logical signal as a logical low signal when the termination status is undesired because more than a selected number of terminators are on the bus; and the comparing facilities generating the logical signal as a logical low signal when the termination status is undesired because less than a selected number of terminators are on the bus. The host adapter card of this embodiment is preferably used when the bus is a SCSI bus, wherein the SCSI bus has a plurality of lines, which include a reset line.

The host adapter card contemplates controller facilities operating the switch facilities to connect the voltage drop facility to the reset line of the SCSI bus upon boot-up of a computer connected to the SCSI bus. In a more specific aspect, this embodiment may connect the host adapter card to a computer having a display screen and an audible indicator. To use such screen and/or indicator, there are provided devices for storing the at least one logical signal; and a controller for reading the stored at least one logical signal to the computer to provide the termination status notice on the screen or by the audible indicator.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for indicating to a user when a bus 100 is not properly terminated, wherein the invention provides a terminator monitoring system 102 and method in conjunction with the SCSI bus 100 to indicate when the bus 100 is either under-terminated or over-terminated. It will be obvious, however, to one skilled in the art, that the present invention may be practiced without some or all of these specific details. In other instances, well-known process operations have not been described in detail in order not to obscure the present invention.

Figure 1:
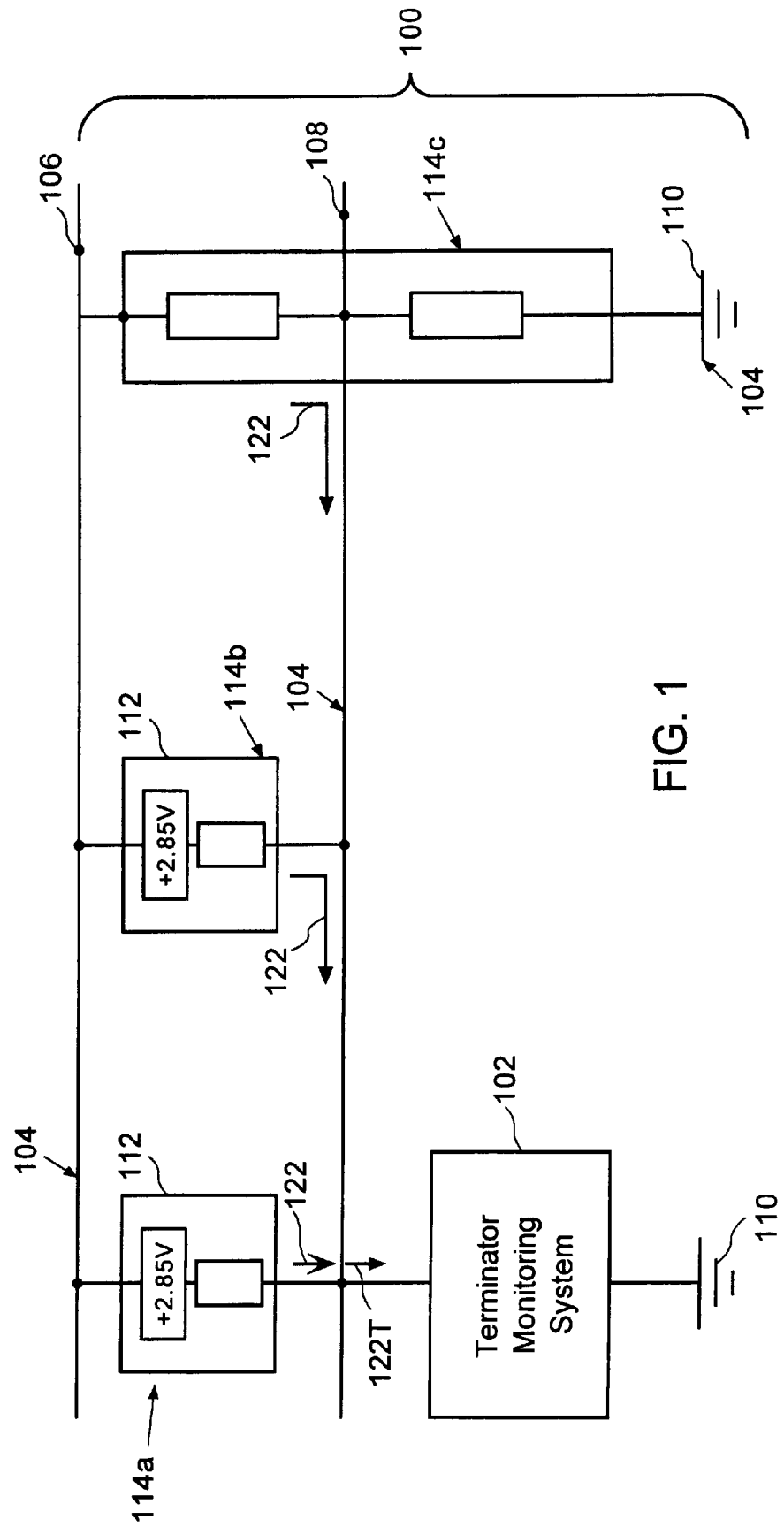
FIG. 1 illustrates a SCSI bus with which the present invention may be used, wherein the SCSI bus has a power line, a reset line, and ground lines.

FIG. 1 shows a simplified diagram of three lines 104 of a bus 100, which may be a SCSI bus, for example, in the use of the present invention. The SCSI bus 100 has twenty-seven lines plus GND and VCC (power lines) 104, of which the three shown are a power line 106, a reset line 108 and a ground line 110. The reset line 108 and the ground line 110 are preferred lines for use with the present invention. As described above, devices 112 having a bus termination capability are said to either be "enabled" or "disabled", where the enabled devices have a current status enabled for bus termination. When the bus 100 is terminated, all twenty seven lines 104 of the SCSI bus 100 are terminated. For more information on SCSI termination, reference may be made to a co-pending U.S. patent application having U.S. Ser. No. 09/078,346, filed on May 13, 1998, entitled "Bus Termination Circuitry and Methods for Implementing the Same," and having inventor Peter K. Cheung. This U.S. patent application is incorporated by reference herein.

Examples of the above-defined "terminator" (any device 112 capable of providing termination of the SCSI bus 100, and which is actually enabled for termination) are the terminators 114 shown connected across the power line 106 and the reset line 108. Such terminators 114 may include, for example, active terminators 114a and 114b, and a passive terminator 114c. Also as described above, the termination status of the SCSI bus 100 is said to be "improper", or "undesired", if at any time more than two terminators 114 are on the SCSI bus 100 (the over-terminated situation), or less than two terminators 114 are on the bus (the under-terminated situation). When the termination status of the SCSI bus 100 is improper, the SCSI bus 100 does not provide proper bus function.

For example, with the improper termination status, one may not read a hard drive having terminator 114a via the SCSI bus 100, or a CPU (not shown) may not acknowledge (or "see") a device having terminator 114b that is connected to the SCSI bus 100. For purposes of description of the present invention, one or more of the terminators 114a, 114b, and 114c (shown as active) may be described as being inactive even though such terminator 114 is shown in FIG. 1 as being active.

Each active terminator 114 conducts, or sources, a known amount of current 122 to the reset line 108 when it is active. The known amount of current 122 may, for example, be about 25 mA. The total current 122T supplied to the system 102 from all of the terminators 114 is shown by an arrow 122T. It may be understood that if there is only one terminator 114 on the bus 100 the total current 122T to the reset line 108 from that one terminator 114 is the exemplary 25 mA. Similarly, from two terminators 114 the total sink current 122T is an exemplary 50 mA, and from three terminators 114 the total sink current 122T is an exemplary 75 mA.

Still referring to FIG. 1, the terminator monitoring system 102 is shown connected between the reset line 108 and the ground line 110 of the SCSI bus 100. The system 102 monitors a number of the terminators 114 on the SCSI bus 100.

Figure 2:
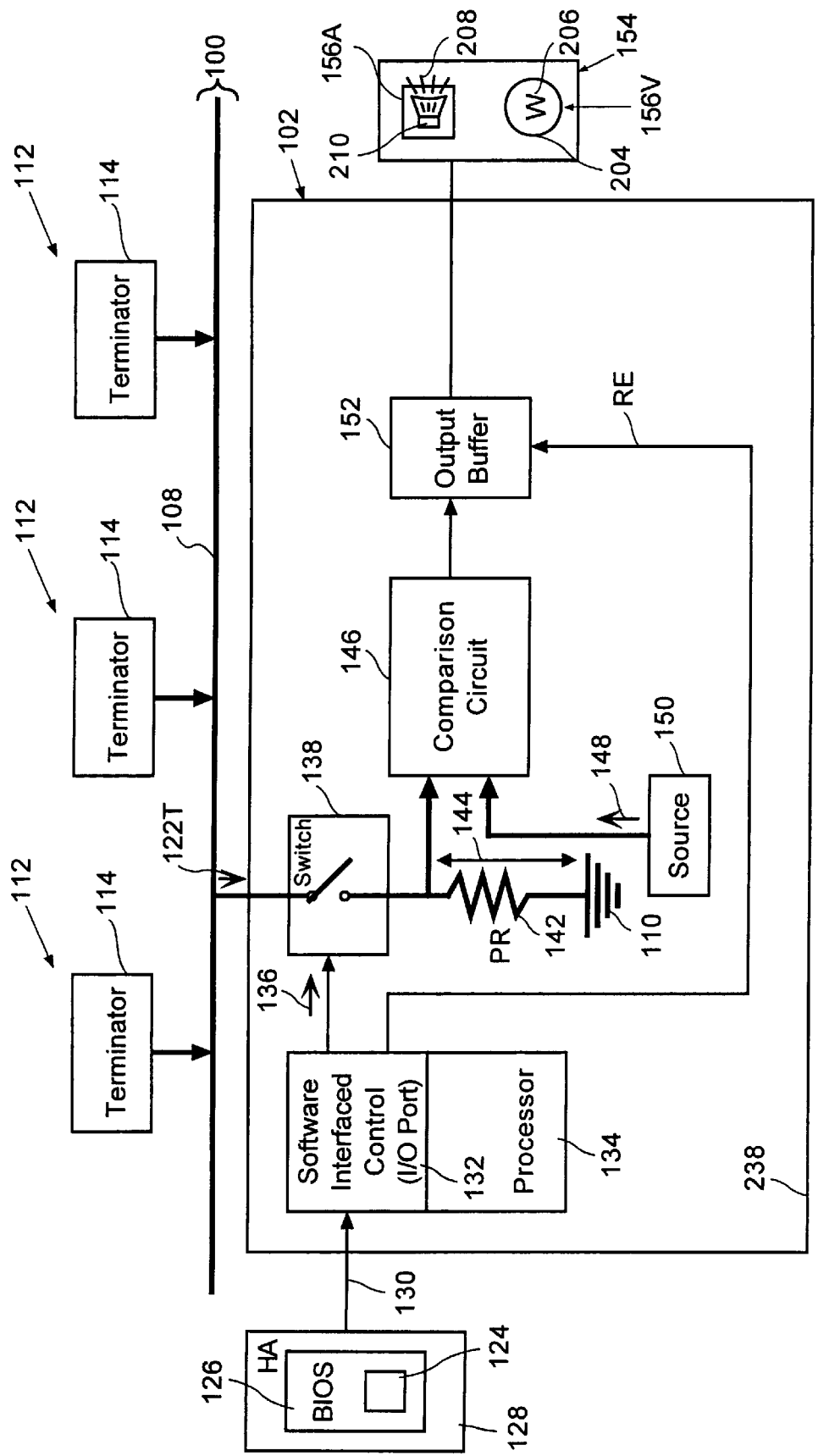
FIG. 2 depicts a block diagram of a system for monitoring the termination status of a SCSI bus.

FIG. 2 is a block diagram of the terminator monitoring system 102, illustrating the basic elements of the system 102. The system 102 is controlled by monitor control software 124 (see also FIG. 7) which is embedded in BIOS 126 of a host adapter 128 which operates with the SCSI bus 100. The monitor control software 124 provides signals 130 to a software-interfaced control 132, such as a general purpose software-controlled Input/Output port of a processor 134. A monitor signal 136 from the I/O port 132 operates a switch 138 which connects the system 102 to the reset line 108, or if connected, which disconnects the connection from the reset line 108. The switch 138 is a low off-capacitance switch, e.g., having a capacitance of less than about 10 picoFarads, for example. When the switch 138 is off, no more than 10 PF of capacitance is introduced by the switch 138 to the SCSI bus 100 such that the bus 100 operates as if the switch 138 is not connected to the bus 100. For example, the switch 138 may be a transistor, an analog switch, or a mechanical switch.

When the switch 138 is closed, a precision resistor 142 is connected to the bus 100. The total current 122T flows through the precision resistor 142 so that a voltage drop 144 is produced across the precision resistor 142. A comparison circuit 146 monitors the value of the produced voltage drop 144 across the precision resistor 142 in comparison with the value of a precision voltage 148 from a source 150 of reference voltages. The comparison circuit 146 provides an indication of the number of terminators 114 on the bus 100, that is, whether the number of terminators 114 on the bus 100 exceeds a limit or is less than the limit. For the SCSI bus 100, the limit is two.

The system 102 may include facilities 152 for storing (i.e., register using suitable output buffer circuit) the output of the comparison circuit 146, and facilities 154 for notifying a system user of an undesired termination condition of the bus 100. The system 102 includes provisions for determining whether only two of the devices 112 have terminations enabled (desired), and via the notifying facilities 154 signals the user via a notice 156 if less than two or more than two of the devices 112 have terminations 114 enabled (undesired). The notice 156 may be a visual notice 156V or an audio notice 156A.

Figure 3:
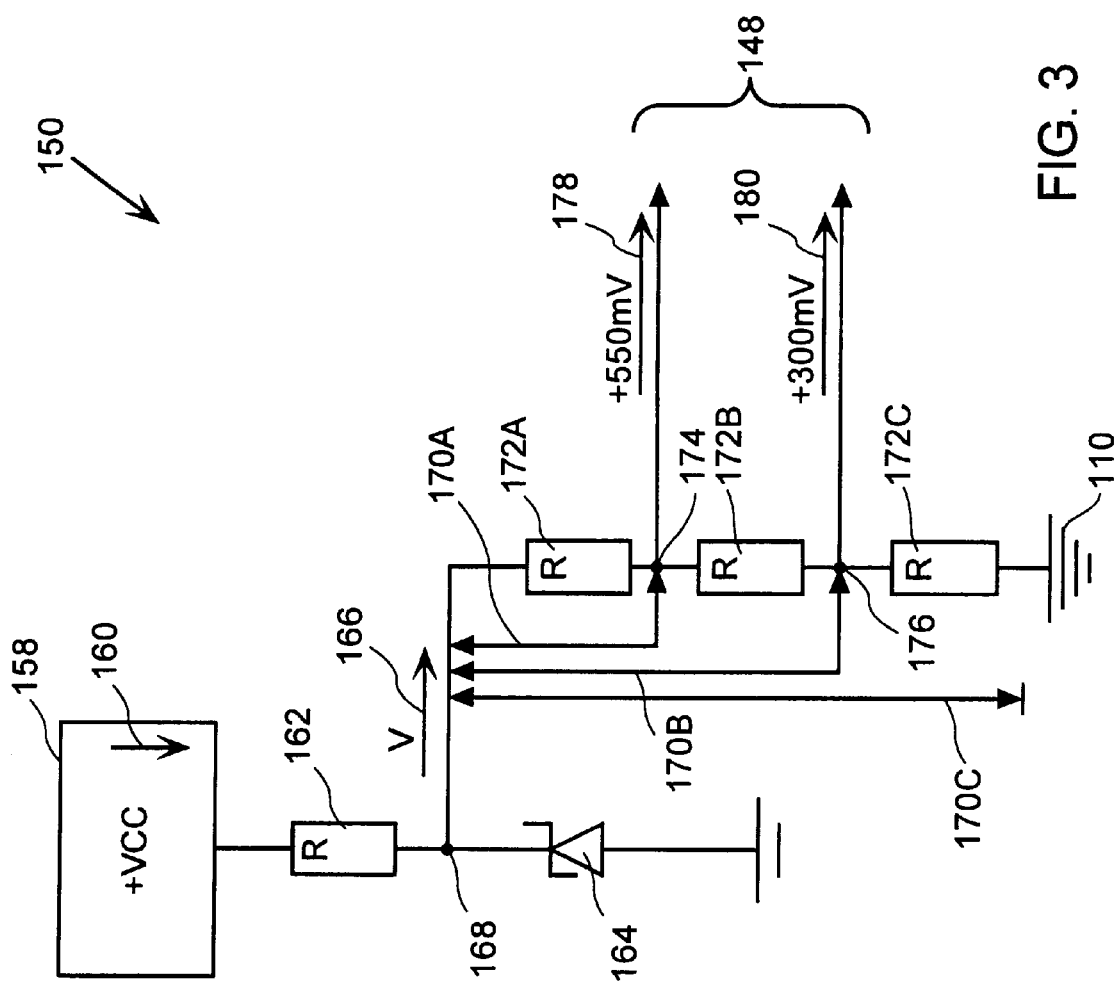
FIG. 3 illustrates a circuit for providing precision reference voltages to a window comparison circuit.

Considering FIG. 3, the source 150 of reference voltages 148 is shown including a power supply 158 which provides an input voltage 160 of +VCC. The +VCC input voltage 160 may range depending on the particular design, however, the voltage may be about 2.5V, 5V, or any other suitable voltage. For the following example, the +VCC input voltage 160 is set to +5V and is supplied across a resistor 162 to a Zener diode 164, which provides a stable voltage 166 at a node 168. For example, the stable voltage 166 at the node 168 may be about 3.3V.

Precision voltage drops 170A, 170B, and 170C are provided by respective resistors 172A, 172B, and 172C, which are connected in series to the ground line 110. With the resistors 172A, 172B, and 172C having respective values of 275 ohms, 25 ohms, and 30 ohms, for example, at points 174 and 176 there are provided first and second 550 mV and 300 mV reference voltages 178 and 180, respectively. These reference voltages 178 and 180 do not vary with variations of the voltage of the power supply 158 due to the Zener diode 164.

Figure 4:
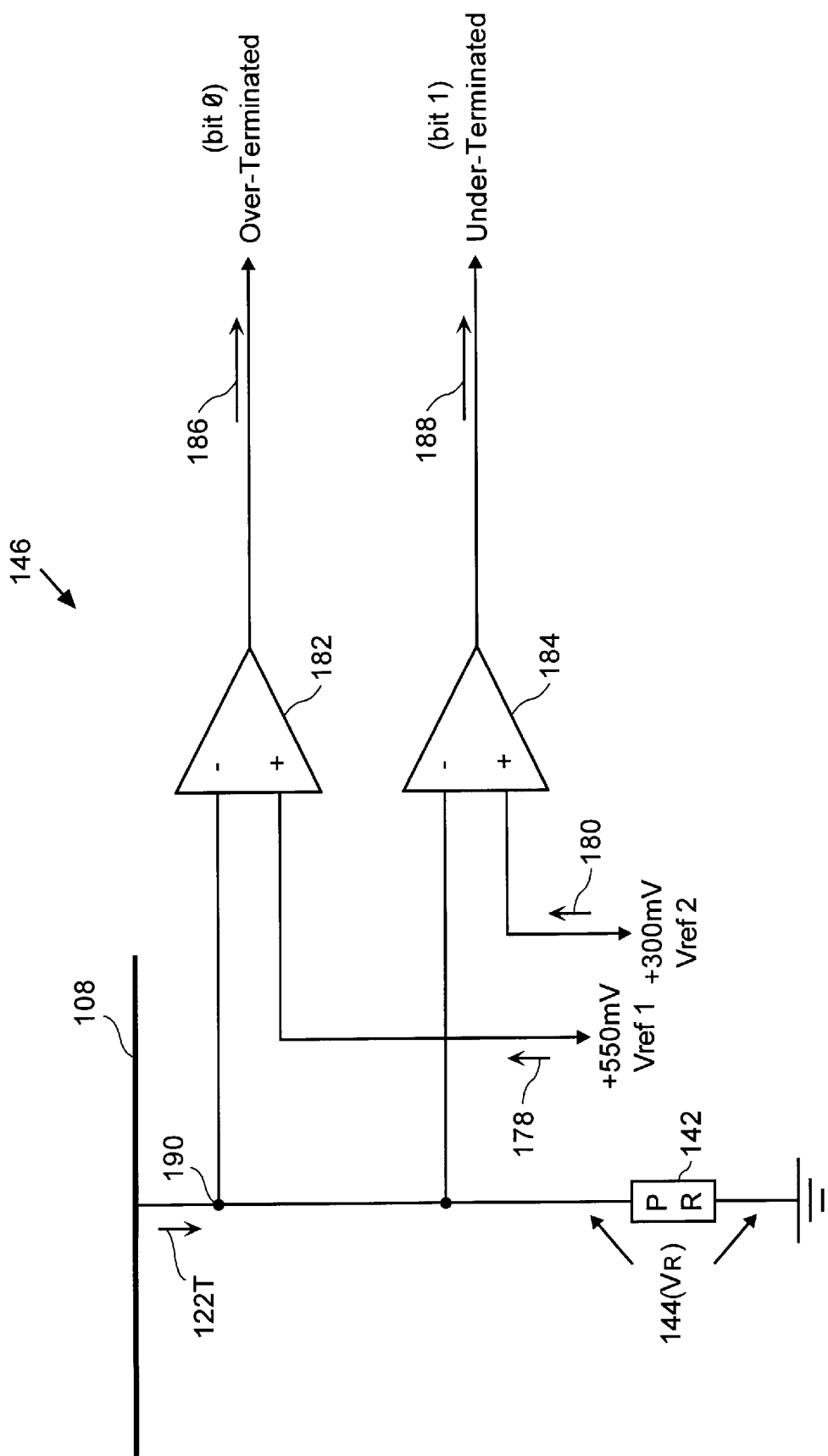
FIG. 4 illustrates the window comparison circuit which uses the precision reference voltages as the basis for comparison with voltages derived from the number of terminators on the SCSI bus.

FIG. 4 illustrates the first 550 mV reference voltage 178 input as one input to a first precision voltage comparator 182 of the comparison circuit 146 and the second 300 mV reference voltage 180 input as one input to a second precision voltage comparator 184 of the comparison circuit 146. The first and second precision voltage comparators 182 and 184 form a window comparator. Although any suitable comparator circuit may be implemented, exemplary comparators 182 and 184 may be Model LM 339 comparators made by National Semiconductor, Santa Clara, Calif.

The first precision voltage comparator 182 is used for detecting the over-terminated situation and outputs a bit 0 signal 186, whereas the second precision voltage comparator 184 is used for detecting the under-terminated situation and outputs a bit 1 signal 188. The reset line 108 is shown connected to a node 190 of the comparison circuit 146, which is also connected as a second input to both the first precision voltage comparator 182 and the second precision voltage comparator 184. The total sink current 122T flows from however many of the devices 112 are terminators 114, if any. The total sink current 122T flows through the precision resistor (PR) 142. The precision resistor 142 may have a value of ten ohms, for example, and provides a VR voltage drop 144 proportional to the total sink current 122T, and therefore proportional to the number of terminators 114 on the SCSI bus 100.

Using Ohms Law (V=IR), and with a ten ohm precision resistor 142, as one exemplary situation in which one terminator 114 is on the SCSI bus 100, the flow of the 25 mA total sink current 122T from the one terminator 114 provides a 250 mV voltage drop 144, which is input to the respective first and second voltage comparators 182 and 184. As another exemplary situation, with the same value precision resistor 142, and if two terminators 114 are on the SCSI bus 100, the flow of the 50 mA total sink current 122T from the two terminators 114 provides a 500 mV voltage drop 144, which is input to the respective first and second voltage comparators 182 and 184. As a third exemplary situation, with the same precision resistor 142, and if three terminators 114 are on the SCSI bus 100, the flow of the 75 mA total sink current 122T from the three terminators 114 provides a 750 mV voltage drop 144, which is input to the respective first and second voltage comparators 182 and 184. Therefore, there is a 250 mV voltage drop 144 per terminator 114 which is on the SCSI bus 100.

In the first exemplary situation, in the operation of the first precision voltage comparator 182, the 250 mV voltage drop 144 is less than the threshold of the 550 mV reference voltage 178 input to the first voltage comparator 182. In this situation, the first voltage comparator 182 outputs a signal of 1 at (bit 0), which represents a logical HIGH for signal 186. The 250 mV voltage drop 144 is also less than the threshold of the 300 mV reference voltage 180 input to the second voltage comparator 184, such that the second voltage comparator 184 outputs a signal of 0 at (bit 1), which represents a logical LOW for signal 188. This data is shown in FIG. 6 for the "under"-terminated situation.

In the third exemplary situation, the 750 mV voltage drop 144 is more than the threshold of the 550 mV reference voltage 178 input to the first voltage comparator 182, such that the first voltage comparator 182 outputs a signal of 0 at (bit 0), which is a logical LOW for signal 186. The 750 mV voltage drop 144 is more than the threshold of the 300 mV reference voltage 180 input to the second voltage comparator 184, such that the second voltage comparator 184 outputs a signal of 1 at (bit 1), which is a logical HIGH for signal 188. This data is shown in FIG. 6 for the "over"-terminated situation.

It may be understood that, for this exemplary embodiment, the signals 186 and 188 produce logical lows only if other than two terminators 114 are on the bus 100. Further, as shown in FIG. 4, the comparators 182 and 184 are connected as voltage dividers relative to the precision resistor 142 that is connected to the bus 100 for providing the voltage drops 144 according to the total sink current 122T. Such comparators 182 and 184 are connected across the precision resistor 142 for measuring such voltage drops 144 to indicate whether there is an improper termination condition of the bus 100.

Figures 5, 6:
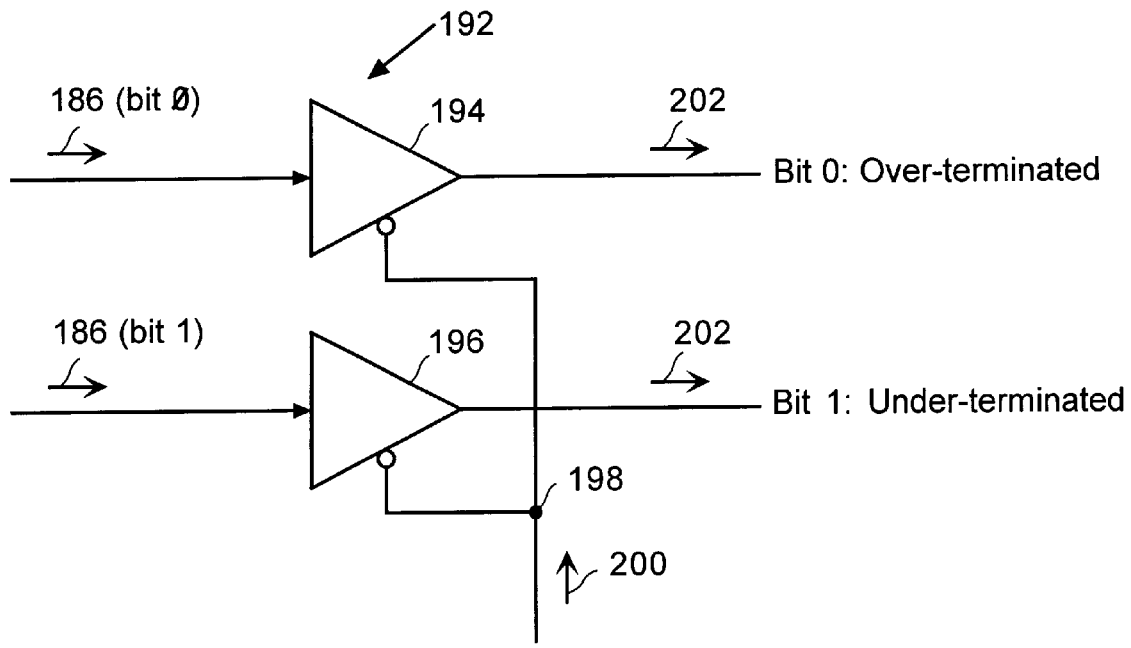
FIG. 5 is a schematic diagram illustrating a buffer circuit for storing the output of the comparison circuit to provide signals indicative of either over-terminated or under-terminated status of the SCSI bus.
FIG. 6 is a chart showing the possible values of the signals according to the termination status of the SCSI bus.

FIG. 5 shows a buffer circuit 192 as including respective first and second buffers 194 and 196. The first buffer 194 stores the bit 0 signal 186, and the second buffer 196 stores the bit 1 signal 188. A read enable (RE) input at node 198 may provide a read input signal 200 to cause the respective stored bit signals 186 and 188 to be read from either or both of the first and second buffers 194 and 196 as data 202 shown in FIG. 6.

Referring to FIG. 6, the chart illustrates the termination status results based on various combinations of bit 1 signal 188 and bit 0 signal 186. Clearly, the total 75 mA sink current 122T from three terminators 114, resulting in the 750 mV voltage drop 144, represents more than two terminators 114 (i.e., represents the "over"-terminated situation depicted in FIG. 6). Also, the 25 mA total sink current 122T from one terminator 114, resulting in the 250 mV voltage drop 144, represents one terminator 114 (i.e., represents the "under"-terminated situation depicted in FIG. 6).

The buffers 194 and 196 thus function as signal generators in response to either of the comparators 182 or 184 determining that the voltage drop 144 across the precision resistor 142 respectively exceeds or is less than the value of the respective voltage reference signal 178 or 180. The buffers 194 and 196 provide the notice 156 indicating that the number of terminators 114 on the bus 100 is improper, as follows. The output data 202 may, for example, be based on (or responsive to) the logical lows produced at signals 186 or 188, and are input to the notice facilities 154. The notice facility 154 may be a video screen 204 (FIG. 2) in which case the notice 156V is a visual signal 206 visually depicting the under-terminated situation or the over-terminated situation, e.g., via "W" to provide a warning. Alternatively, the notice 156A may be an audible signal 208 (e.g., a noise) generated by a speaker 210 to audibly notify the user of the under-terminated situation or the over-terminated situation.

Figure 7:
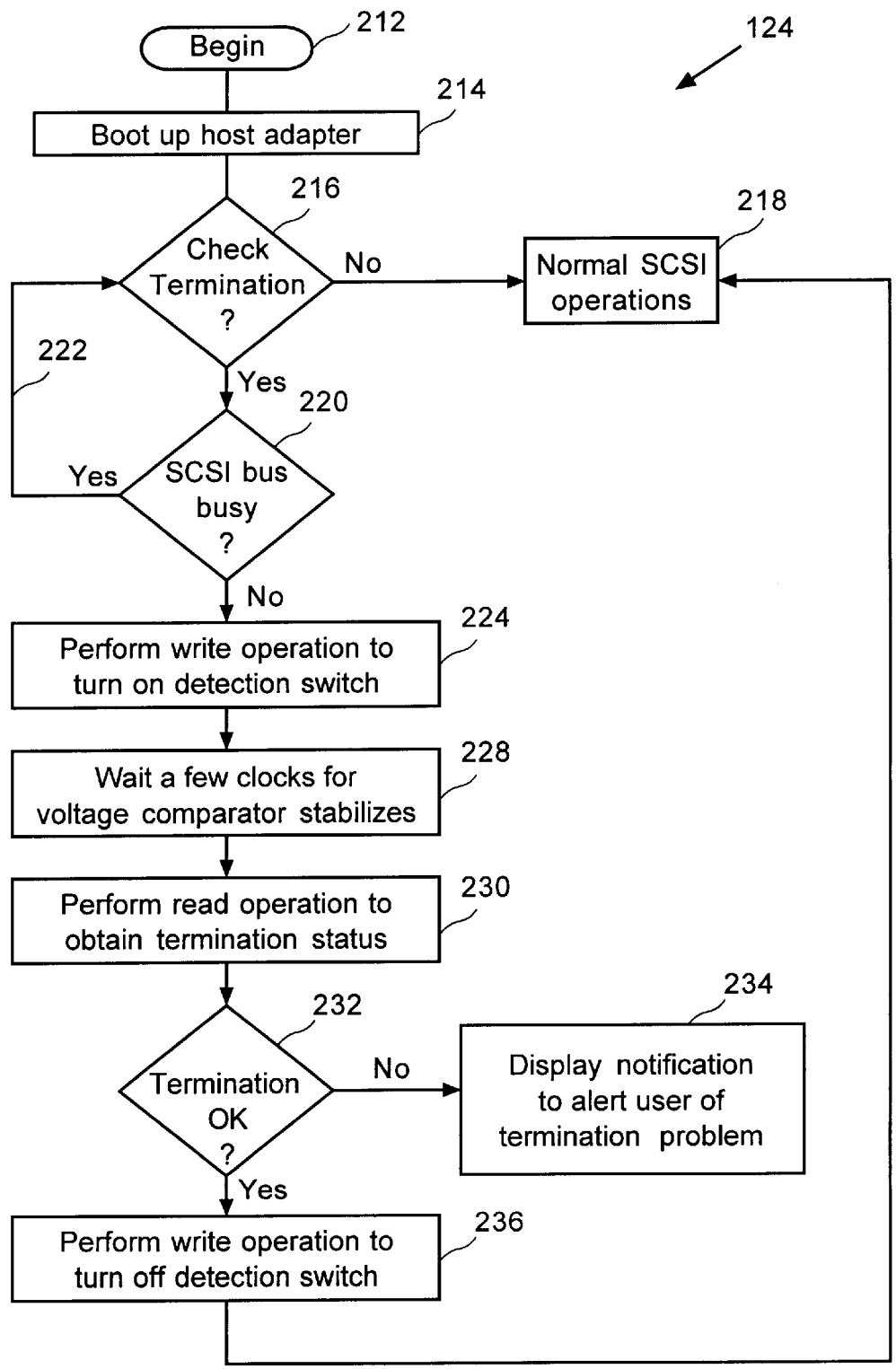
FIG. 7 is a flow chart of software used to control the operation of the system and the performance of the method, for monitoring the termination status of the SCSI bus.

Referring to FIG. 7, the operation of the monitor control software 124 of the terminator monitoring system 102 of the present invention may be understood. After a begin operation 212, in an operation 214 the host adapter 128 is booted up. An operation 216 then determines whether the termination status of the SCSI bus 100 should be checked. If "no", then in operation 218, normal SCSI operations take place. If "yes", then operation 220 is performed and a determination is made as to whether the SCSI bus 100 is busy. If busy, there is a loop 222 back to operation 216 to again determine whether the termination status should be checked. If not busy, in operation 224 a write operation is performed to send the monitor signal 136 (FIG. 2) to the switch 138 and turn it ON.

The switch 138 thereby conducts the total sink current 122T to the system 102, and in particular, to the ground line 110 across the precision resistor 142. After a few clocks delay imposed by operation 228, the respective first and second voltage comparators 182 and 184 stabilize, and the voltage drops 144 are compared to the applicable reference voltages 148. The respective first and second comparators 182 and 184 output their respective bit 0 or bit 1 signals 186 or 188 to the respective buffer 194 or 196. With the signals 186 and 188 in the respective buffers 194 and 196, in operation 230 a read operation is performed such that the buffers 194 and 198 output the data 202 as shown in FIG. 6, for example, indicating the termination status of the SCSI bus 100.

Then, according to the determined termination status, if the termination status is undesired (e.g., over or under), in operation 232 the data 202 is sent to the notifying facility 154. In operation 234, the respective signals 206 and/or 208 are displayed (or sounded) to alert the user of the termination status problem. If only two terminators 114 are on the bus 100, the termination status is "OK", and in operation 236 the switch 138 is opened to discontinue the monitoring of the number of terminators 114 on the bus. Normal bus operations continue according to operation 218.

It may be understood, then, that the host adapter 128 may be in the form of a customized card 238, which has the above-described termination status notice capability for use with the bus 100 to indicate an undesired termination status of the bus 100. The customized host adapter card 238 supports the circuitry shown in FIG. 2, including the precision resistor 142 and the source 150. The card 238 also provides the switch 138 for connecting the bus 100 to provide the total sink current 122T to the precision resistor 142 of the system 102. The voltage drop 144 is produced in response to the total sink current 122T.

The host adapter card 238 further mounts the comparators 182 and 184, which compare the voltage drop 144 in response to the total sink current 122T from the bus 100 to at least the one reference voltage 148 (e.g., 550 mV) to generate at least one of the logical signals 186 or 188 indicative of the terminator status of the bus 100. The card 238 also mounts the buffer circuit 192, which stores the logical states of the signals 186 and 188. The facilities 156 respond to the data 202 for notifying the user of the termination status.

The present invention may be implemented using any type of integrated circuit logic, state machines, or software driven computer-implemented operations; and may employ various computer-implemented operations involving data stored in computer systems to drive computer peripheral devices (i.e., in the form of software drivers). These operations are those requiring physical manipulation of physical quantities. Usually, though not necessarily, these quantities take the form of electrical or magnetic signals capable of being stored, transferred, combined, compared and otherwise manipulated. Further, the manipulations performed are often referred to in terms, such as producing, identifying, determining, or comparing.

Any of the operations described herein that form part of the invention are useful machine operations. The invention also relates to a device or apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A system for monitoring a number of terminators on a bus, the system comprising:

a precision resistor connectable to the bus so that a voltage drop is produced across the precision resistor; and a circuit for monitoring the value of the produced voltage drop across the precision resistor to provide an indication of the number of terminators on the bus.

2. A system for monitoring according to claim 1, further comprising:

a switch for connecting the precision resistor to the bus;

a source of a reference voltage; and the monitoring circuit comprising a comparison circuit responsive to the voltage drop across the precision resistor and to the reference voltage for indicating whether the number of terminators on the bus exceeds a limit or is less than the limit.

3. A system for monitoring according to claim 2, further comprising:

a controller for operating the switch upon boot-up of the system.

4. A system for monitoring according to claim 1, wherein the terminators may be enabled for termination of the bus or disabled to not provide termination of the bus, and wherein the number of terminators enabled may be improper, the monitoring circuit comprising:

a source of a plurality of voltage reference signals;

a comparison circuit for each of the plurality of reference signals for determining whether the voltage drop across the precision resistor exceeds or is less than the value of the respective voltage reference signal; and a signal generator responsive to either of the comparison circuits determining that the voltage drop across the precision resistor respectively exceeds or is less than the value of the respective voltage reference signal for providing a notice signal indicating that the number of terminators on the bus is improper.

5. A system for monitoring according to claim 4, wherein:

when a first of the comparison circuits determines that the voltage drop across the precision resistor exceeds the value of the respective voltage reference signal, the first circuit generates a first logical low signal;

when a second of the comparison circuits determines that the voltage drop across the precision resistor is less than the value of the respective voltage reference signal, the second circuit generates a second logical low signal; and the signal generator provides the notice signal in response to either the first or the second logical low signals.

6. A system for monitoring according to claim 5, wherein:

the signal generator comprises an output buffer for storing the notice signal and an indicator responsive to the notice signal; and a controller provides a read command for causing the notice signal to be read to the indicator.

7. A system for monitoring according to claim 5, wherein:

the bus complies with the SCSI standard and is provided with a reset line, and the precision resistor is connectable to the reset line.

8. A system for notifying a system user of an improper termination condition of a bus, wherein each of a plurality of devices connected to the bus may have a termination enabled, said system comprising:

means for determining whether only two of the devices have terminations enabled; and means for signaling to provide a notice to the user if less than two or more than two of the devices have terminations enabled.

9. A system according to claim 8, said determining means comprising:

precision resistance means connected to the bus for providing a voltage drop;

means for measuring the voltage drop across the precision resistance means and comparing the voltage drop across the precision resistance means to a first and a second reference voltage.

10. A system according to claim 8, said determining circuit comprising:

precision resistance means connected to the bus for generating a voltage drop;

switch means for connecting the precision resistance means to the bus so that the voltage drop appears across the resistance means; and means for comparing the voltage drop across the precision resistance means to a reference voltage to indicate whether there is an improper termination condition of the bus.

11. A system according to claim 9, wherein:

said comparing means comprises means for generating a logical low signal if either the voltage drop exceeds the first reference voltage or the voltage drop is less than the second reference voltage.

12. A system according to claim 11, wherein:

the signaling means responds to the logical low signal for providing the notice to the user.

13. A system according to claim 9, wherein the improper termination condition exists if either more or less than two terminators are connected to the bus, and wherein:

the comparing means generates the logical low signal if other than two terminators are connected to the bus.

14. A computer implemented method for determining the termination status of a bus, wherein devices connected to the bus may either have an enabled terminator status or a disabled terminator status, and wherein the devices having the enabled terminator status conduct current, the method comprising:

providing at least one reference signal;

comparing the at least one reference signal to a signal generated by the current through a resistor; and determining the termination status of the bus according to the results of the comparing operation.

15. A computer implemented method according to claim 14, wherein the termination status may either be over-terminated or under-terminated, wherein:

the comparing operation comprises comparing a first of the at least one reference signal to the generated signal to determine whether the terminated status is over-terminated; and separately comparing a second of the at least one reference signal to the generated signal to determine whether the terminated status is under-terminated.

16. A computer implemented method according to claim 14, wherein:

the comparing operation comprises comparing a first of the at least one reference signal to the generated signal to determine whether the number of devices having the enabled terminator status exceeds a first limit, and separately comparing a second of the at least one reference signal to the generated signal to determine whether the number of devices having the enabled terminator status is less than the first limit.

17. The computer implemented method according to claim 14, the method further comprising:

before performing the operations set forth in claim 13, determining whether the bus is busy; and if the bus is not busy, connecting the resistor to the bus.

18. The computer implemented method according to claim 17, the method further comprising:

after the determining operation, disconnecting the resistor from the bus.

19. The computer implemented method according to claim 14, the method further comprising:

if the termination status is undesired, causing a notice to be displayed on the computer to indicate the undesired status.

20. The computer implemented method according to claim 15, the method further comprising:

if the undesired termination status is over-terminated or under-terminated, causing a notice to be displayed on the computer to indicate that the status is over-terminated or under-terminated.

21. The computer implemented method according to claim 16, the method further comprising:

if the number of devices having the terminator status does not equal the first limit, causing a notice to be displayed on the computer to indicate an undesired terminator status.

22. The computer implemented method according to claim 21, wherein the termination status is undesired if more or less than two of the devices connected to the bus have an enabled terminator status, and the bus is a SCSI bus; the method further comprising:

if the terminator status is undesired, causing a notice to be displayed on the computer to indicate the terminator status.

23. The computer implemented method according to claim 14, wherein the bus is a SCSI bus having a reset line and the resistor is connected to the reset line.

24. A host adapter card having a terminator status notice capability for use with a bus to indicate undesired terminator status of the bus, the card comprising:

means for producing a voltage drop in response to a current;

switch means for connecting the voltage drop means to the bus to provide the current to the voltage drop means; and means for comparing the voltage drop in response to the current from the bus to at least one reference voltage to generate at least one logical signal indicative of the terminator status of the bus.

25. A host adapter card according to claim 24, further comprising:

means for storing the at least one logical signal.

26. A host adapter card according to claim 24, wherein:

the comparing means generates the logical signal as a logical low signal when the terminator status is undesired because more than a selected number of terminators are on the bus.

27. A host adapter card according to claim 24, wherein:

the comparing means generates the logical signal as a logical low signal when the terminator status is undesired because less than a selected number of terminators are on the bus.

28. A host adapter card according to claim 24, wherein the bus is a SCSI bus, the SCSI bus having a plurality of lines, the plurality of lines including a reset line, the host adapter card further comprising:

controller means for operating the switch means to connect the voltage drop means to the reset line of the SCSI bus upon boot-up of a computer connected to the SCSI bus.

29. A host adapter card according to claim 24, wherein the host adapter card is connected to a computer having a display screen and an audible indicator, the host adapter card further comprising:

means for storing the at least one logical signal; and controller means for reading the stored at least one logical signal to the computer to provide the terminator status notice on the screen or by the audible indicator.

30. A host adapter card according to claim 24, wherein the comparing means generates the logical signal as a logical low signal indicative of an undesired terminator status of the bus.

31. A host adapter card according to claim 24, wherein the termination status may either be over-terminated or under-terminated, and wherein:

the comparing means compares a first of the at least one reference signal to the voltage drop to determine whether the terminated status is over-terminated; and the comparing means separately compares a second of the at least one reference signal to the voltage drop to determine whether the terminated status is under-terminated.

* * * * *